(12) United States Patent
Cheng et al.

(10) Patent No.: US 9,202,893 B2
(45) Date of Patent: Dec. 1, 2015

(54) U-SHAPED SEMICONDUCTOR STRUCTURE

(71) Applicant: INTERNATIONAL BUSINESS MACHINES CORPORATION, Armonk, NY (US)

(72) Inventors: Kangguo Cheng, Schenectady, NY (US); Bruce B. Doris, Brewster, NY (US); Pouya Hashemi, White Plains, NY (US); Ali Khakifirooz, Mountain View, CA (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 13/968,169

(22) Filed: Aug. 15, 2013

(65) Prior Publication Data

US 2014/0239398 A1  Aug. 28, 2014

Related U.S. Application Data

(63) Continuation of application No. 13/775,917, filed on Feb. 25, 2013, now Pat. No. 8,956,932.

(51) Int. Cl.
*H01L 29/78* (2006.01)
*H01L 29/66* (2006.01)
*H01L 21/02* (2006.01)

(52) U.S. Cl.
CPC .... *H01L 29/66795* (2013.01); *H01L 21/02494* (2013.01); *H01L 21/02587* (2013.01); *H01L 29/7853* (2013.01)

(58) Field of Classification Search
CPC ............... H01L 29/785; H01L 29/7853; H01L 21/823431; H01L 21/823821; H01L 21/845; H01L 21/7624; H01L 21/76264; H01L 21/84; H01L 27/1203; H01L 27/0886; H01L 27/0924; H01L 27/1211; H01L 29/41791; H01L 29/66795
USPC ........................................................ 257/347
See application file for complete search history.

(56) References Cited

U.S. PATENT DOCUMENTS

| | | | |
|---|---|---|---|
| 6,475,890 B1 | 11/2002 | Yu | |
| 6,562,665 B1 * | 5/2003 | Yu | 438/149 |
| 7,271,448 B2 * | 9/2007 | Hsu et al. | 257/365 |
| 7,378,710 B2 | 5/2008 | Breitwisch et al. | |
| 7,413,941 B2 * | 8/2008 | Zhang et al. | 438/164 |
| 7,666,723 B2 | 2/2010 | Frank et al. | |
| 8,158,484 B2 | 4/2012 | Orlowski et al. | |

(Continued)

OTHER PUBLICATIONS

La Tulipe, D., et al. "Upside-Down FETS" 2008 IEEE International SOI Conference Proceedings. IEEE International SOI Conference. Oct. 2008. pp. 23-34.

(Continued)

*Primary Examiner* — Khiem D Nguyen
*Assistant Examiner* — Pauline Vu
(74) *Attorney, Agent, or Firm* — Tutunjian & Bitetto, P.C.

(57) ABSTRACT

A method for forming a U-shaped semiconductor device includes forming trenches in a crystalline layer and epitaxially growing a U-shaped semiconductor material along sidewalls and bottoms of the trenches. The U-shaped semiconductor material is anchored, and the crystalline layer is removed. The U-shaped semiconductor material is supported by backfilling underneath the U-shaped semiconductor material with a dielectric material. A semiconductor device is formed with the U-shaped semiconductor material.

12 Claims, 7 Drawing Sheets

(56) References Cited

U.S. PATENT DOCUMENTS

| | | |
|---|---|---|
| 2006/0063332 A1* | 3/2006 | Doyle et al. .................. 438/267 |
| 2007/0093010 A1 | 4/2007 | Mathew et al. |
| 2007/0096148 A1 | 5/2007 | Hoentschel et al. |
| 2008/0237575 A1* | 10/2008 | Jin et al. .......................... 257/19 |
| 2009/0170251 A1* | 7/2009 | Jin et al. ........................ 438/197 |
| 2010/0164102 A1* | 7/2010 | Rachmady et al. ........... 257/741 |
| 2011/0241073 A1 | 10/2011 | Cohen et al. |
| 2011/0284967 A1* | 11/2011 | Cheng et al. .................. 257/368 |
| 2012/0204513 A1 | 8/2012 | Skarin et al. |

OTHER PUBLICATIONS

Mathew, L., et al. "Inverted T Channel FET (ITFET)—Fabrication and Charateristics of Vertical-Horizontal, Thin Body, Multi-Gate, Multi-Orientation Devices, ITFET SRAM Bit-Cell Operation. A Novel Technology for 45NM and Beyond CMOS." IEEE International Electron Devices Meeting, IEDM. Dec. 2005. pp. 713-716.

* cited by examiner

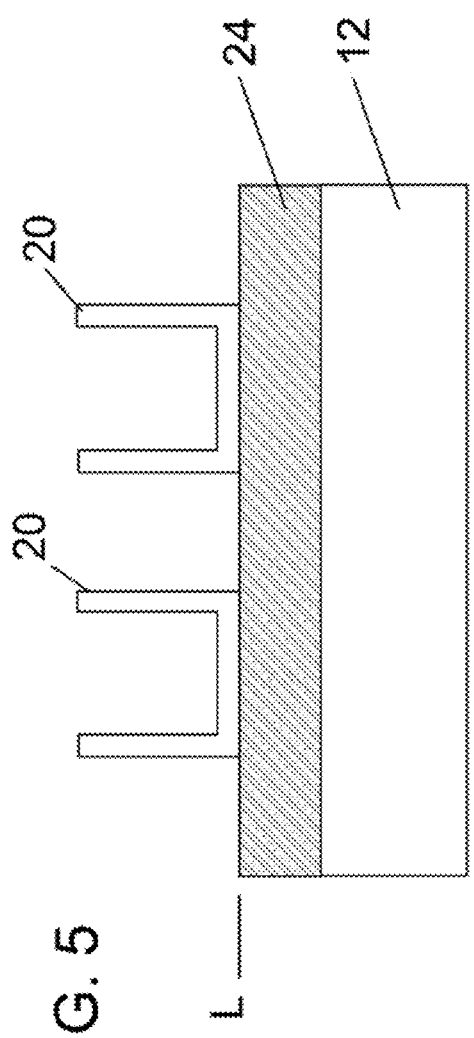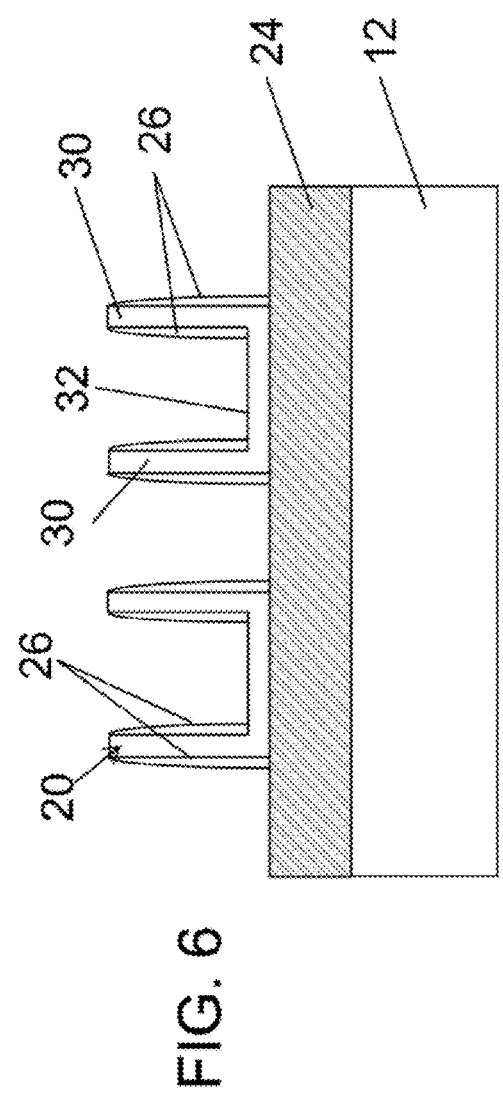

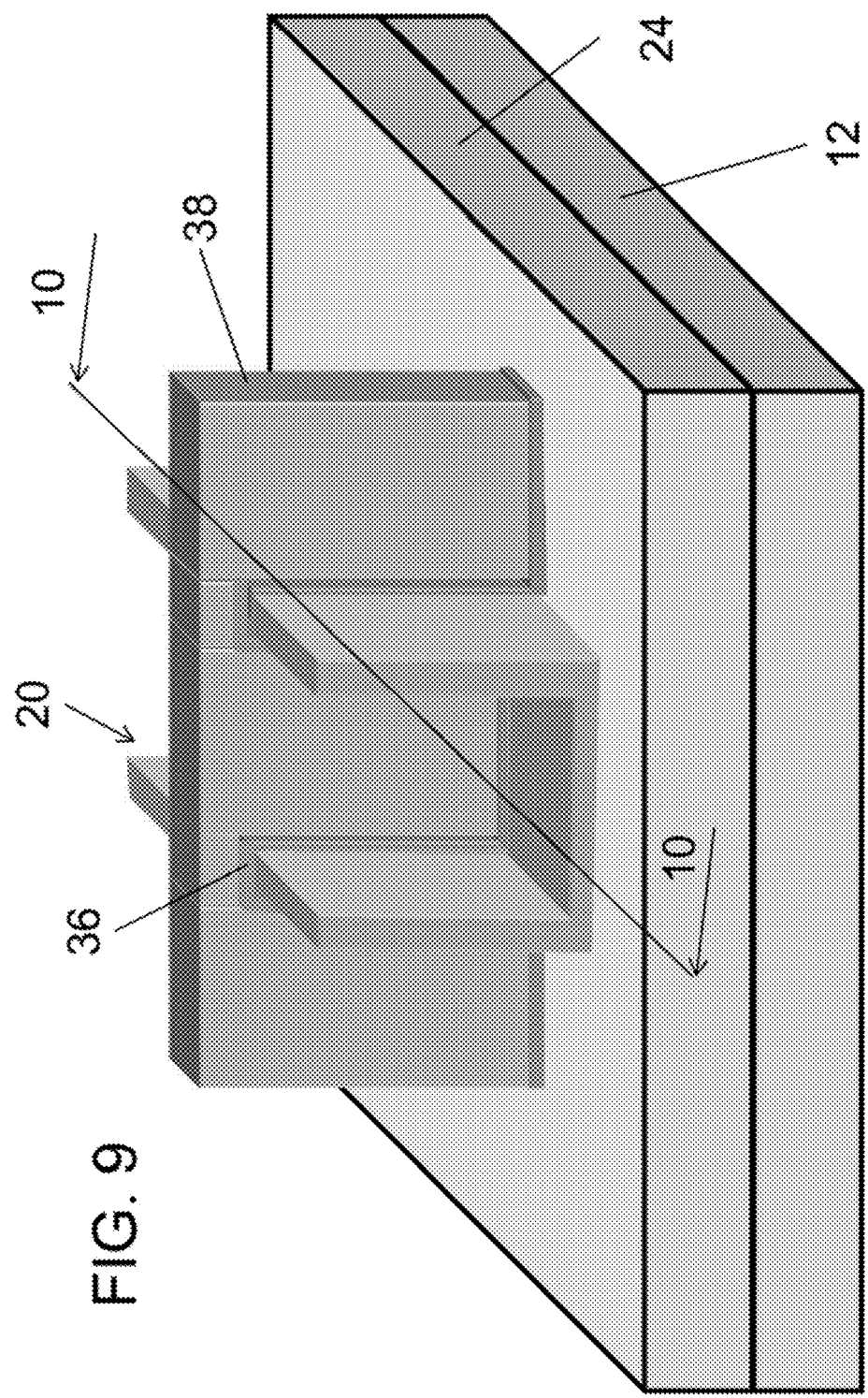

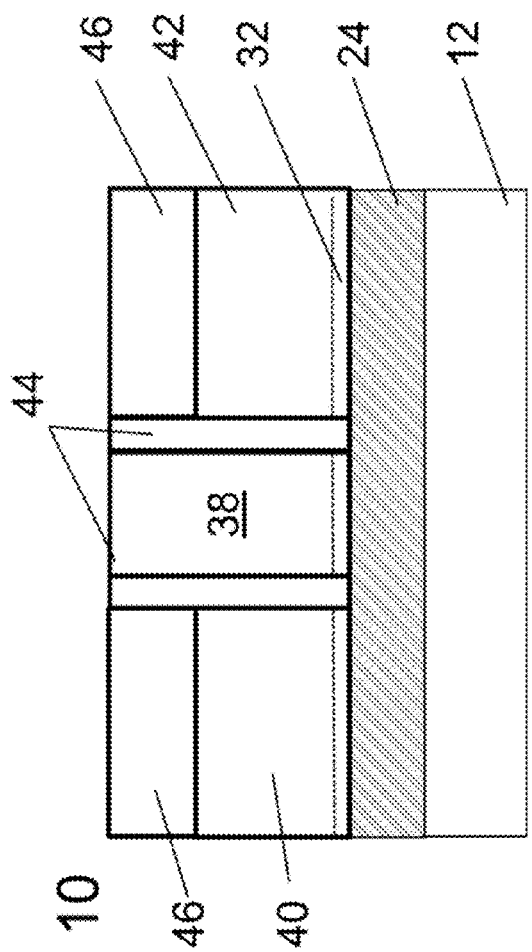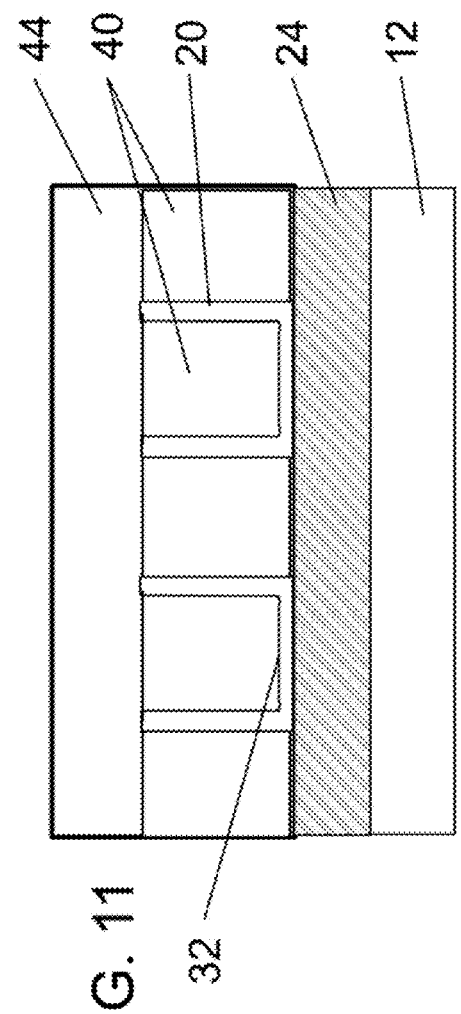

U-SHAPED SEMICONDUCTOR STRUCTURE

RELATED APPLICATION DATA

This application is a Continuation application of co-pending U.S. patent application Ser. No. 13/775,917 filed on Feb. 25, 2013, incorporated herein by reference in its entirety.

BACKGROUND

1. Technical Field

The present invention relates to semiconductor devices and fabricating methods, and more particularly to U-shaped structures and methods for semiconductor devices.

2. Description of the Related Art

Fin field effect transistors (finFETs) have become an important option for technologies of 20 nm and beyond. One of the major issues with finFET technology is device width quantization, which causes device design challenges for devices, such as in, e.g., SRAM designs.

In addition, T-shaped fins have been produced, which include the top of the "T" as a base and a vertical portion of the T extending upward from the base. T-shaped fins suffer from thickness control issues of the base of the inverted T. Current processing techniques leave the edges of the base non-uniform on the remaining sections of the base, and the thickness is not well-controlled. These thickness control issues lead to performance issues in the completed device.

SUMMARY

A method for forming a U-shaped semiconductor device includes forming trenches in a crystalline layer and epitaxially growing a U-shaped semiconductor material along sidewalls and bottoms of the trenches. The U-shaped semiconductor material is anchored, and the crystalline layer is removed. The U-shaped semiconductor material is supported by backfilling underneath the U-shaped semiconductor material with a dielectric material. A semiconductor device is formed with the U-shaped semiconductor material.

A method for forming a transistor with a U-shaped channel includes growing a crystalline layer on a monocrystalline substrate; forming trenches in the crystalline layer; epitaxially growing a U-shaped semiconductor material along sidewalls and bottoms of the trenches to form U-shaped fins; anchoring the U-shaped fins and selectively removing the crystalline layer; supporting the U-shaped fins by backfilling underneath the U-shaped fins with a dielectric material; forming a gate dielectric and a gate structure transversely over a longitudinal direction of the U-shaped fins; forming spacers parallel to the gate structure; and forming source and drain regions adjacent to the spacers by epitaxially growing the source and drain regions from the U-shaped semiconductor material.

A U-shaped semiconductor device includes a U-shaped semiconductor material having a lateral portion and two upright portions integrally formed with and extending from the lateral portion. The U-shaped semiconductor material is monocrystalline and forms a fin structure with a U-shaped cross-section. The U-shaped semiconductor material is supported by a backfilled dielectric material formed underneath the U-shaped semiconductor material. A gate structure is formed transversely to a longitudinal axis of the fin structure. Source and drain regions are formed on opposite sides of the gate structure and are formed on the fin structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 5 is a cross-sectional view of the structure of FIG. 4 having the U-shaped semiconductor layer supported by a backfilled and recessed dielectric in accordance with the present principles;

FIG. 6 is a cross-sectional view of the structure of FIG. 5 having spacers formed on upright portions of the U-shaped semiconductor layer in accordance with the present principles;

FIG. 9 is a perspective view of the structure of FIG. 8 with a gate dielectric and gate structure formed over the U-shaped semiconductor layer (fin or line) in accordance with the present principles;

FIG. 10 is a cross-sectional view of the structure of FIG. 9 with spacers formed, source and drain regions formed and a field oxide planarized in accordance with the present principles;

FIG. 11 is a cross-sectional view of the structure of FIG. 10 rotated 90 degrees to look down the fin in accordance with the present principles.

DETAILED DESCRIPTION OF PREFERRED EMBODIMENTS

Figure 1:
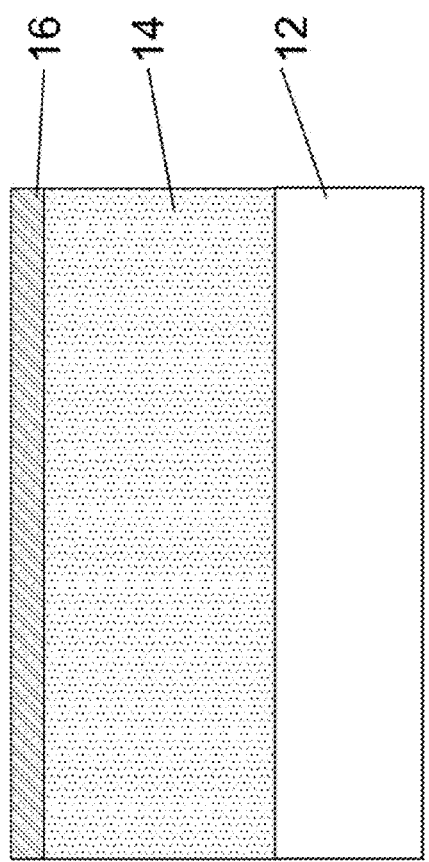
FIG. 1 is a cross-sectional view of a substrate having a crystalline layer and a hard mask layer formed thereon in accordance with the present principles.

In accordance with the present principles, methods and structures are provided for forming a U-shaped semiconductor structure. The U-shape structure may be employed to form a semiconductor channel for a fin field effect transistor (finFET). The U-shaped structure may be employed for other devices as well. In one embodiment, the U-shaped structure provides a longer channel width (e.g., horizontal and vertical sections of the U) without consuming valuable layout area. The U-shaped semiconductor material eases design constraints for the device width when compared with conventional finFETs. In addition, the device width granularity (i.e., different sizes of device widths) is improved, and several device widths may be employed on a same chip and by employing the same process steps. Further, precise control of fully depleted device channel thickness is provided in accordance with the present principles. Horizontal portions of the U have a well-controlled thickness as do the vertical sections in accordance with the present methods.

It is to be understood that the present invention will be described in terms of a given illustrative architecture formed using a bulk substrate or wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound, such as, e.g., dopants, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a semiconductor substrate 12 with an epitaxially grown layer 14 and a hard mask layer 16 formed thereon is shown in accordance with one illustrative embodiment. In this illustrative example, the substrate 12 includes a bulk monocrystalline substrate and may include a material such as silicon, silicon carbide, silicon germanium, or other substrate material on which a crystalline layer 14 may be epitaxially grown. In one embodiment, the substrate 12 includes silicon and the crystalline layer 14 includes silicon germanium. In this way, silicon germanium can be selectively removed relative to the substrate 12 in later steps. The crystalline layer 14 is epitaxially grown using one of plasma enhanced chemical vapor deposition, molecular beam epitaxy, atomic level deposition or the like. The thickness of the crystalline layer 14 can be used to control a vertical height of the eventually formed U-shaped semiconductor as the thickness of the crystalline layer 14 needs to be of sufficient dimension to permit the U-shaped structure to fit therein as will be clear in the next steps.

The hard mask layer 16 is deposited over the crystalline layer 14. The hard mask layer 16 includes a thickness to permit etching to an adequate depth within the crystalline layer 16. The hard mask layer 16 may include silicon nitride or any other suitable hard mask material.

Figure 2:
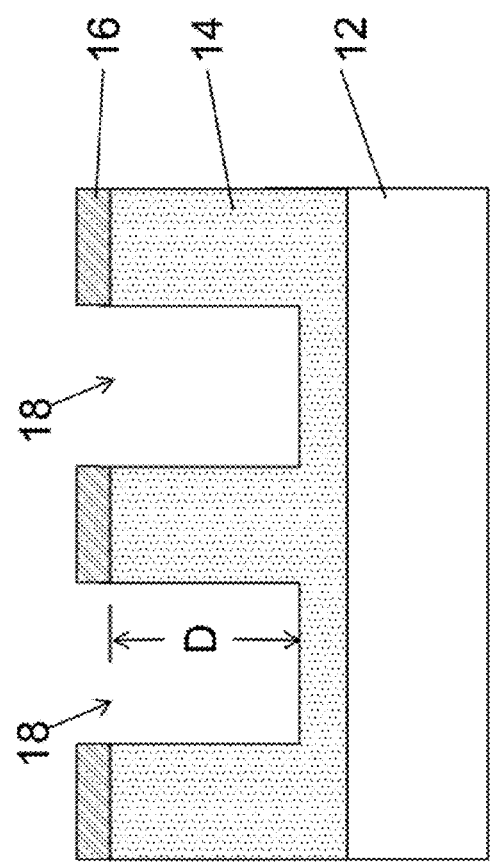
FIG. 2 is a cross-sectional view of the structure of FIG. 1 having trenches formed in the crystalline layer according to a hard mask in accordance with the present principles.

Referring to FIG. 2, the hard mask layer 16 is patterned to form a hard mask for etching the crystalline layer 14. The hard mask layer 16 may be patterned using lithographic techniques, using sidewall image transfer (SIT) techniques or any other suitable technique. The crystalline layer 14 is etched to form trenches 18 in the crystalline layer 14 to a depth D in accordance with the hard mask formed from the hard mask layer 16. The depth D will substantially be the vertical dimension of the completed U-shaped structure. In particularly useful embodiments, the depth D is between about 15 nm to about 100 nm, although other dimensions may be employed.

Figure 3:
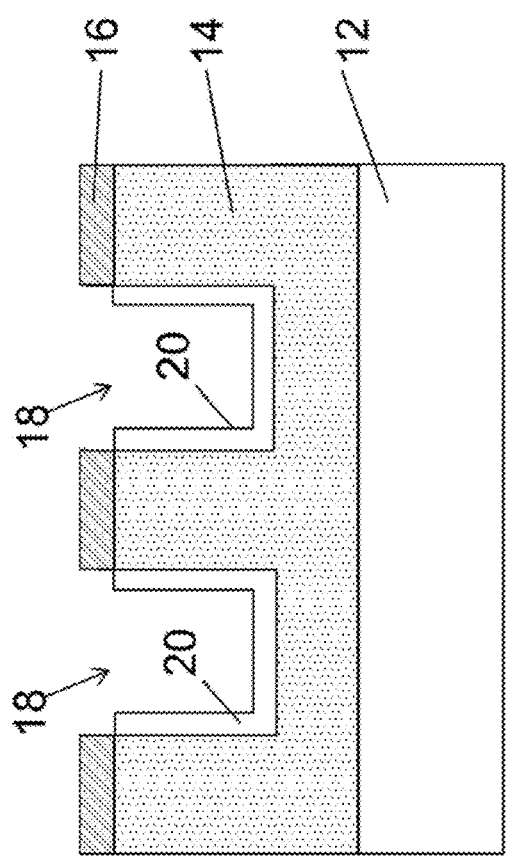
FIG. 3 is a cross-sectional view of the structure of FIG. 2 having an epitaxially grown U-shaped semiconductor layer formed in the trenches in accordance with the present principles.

Referring to FIG. 3, a U-shaped semiconductor layer 20 is epitaxially grown within the trenches 18 of the crystalline layer 14. The U-shaped semiconductor layer 20 includes a controlled thickness which is proportional to the width of a transistor device eventually formed using the U-shaped semiconductor layer 20. In particularly useful embodiments, the thickness of U-shaped semiconductor layer 20 is, e.g., about 5 nm to about 30 nm. The U-shaped semiconductor layer 20 may include a monocrystalline form of silicon although other materials may be employed. In an alternate embodiment, the U-shaped semiconductor layer 20 may be formed in a semiconductor layer of a semiconductor on insulator structure.

Figure 4:
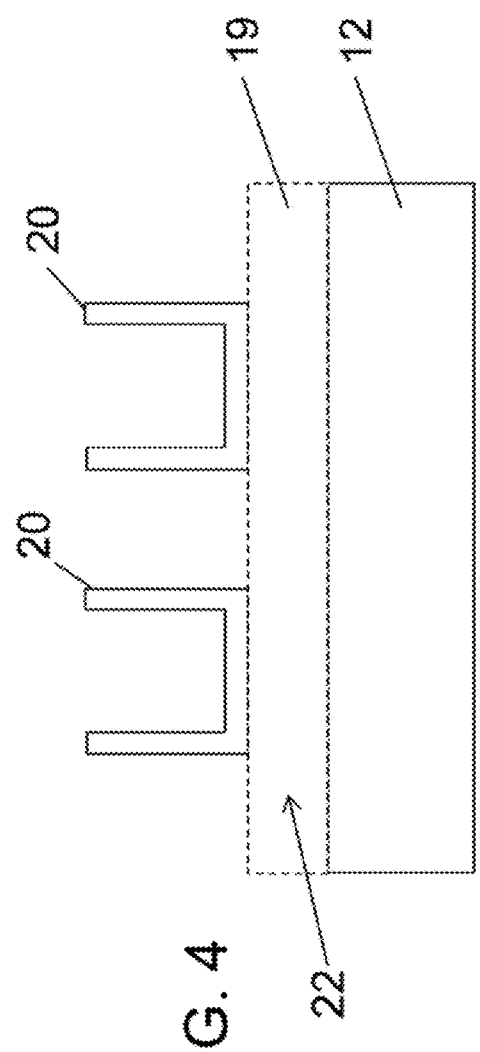
FIG. 4 is a cross-sectional view of the structure of FIG. 3 having the crystalline layer removed to form a cavity below the U-shaped semiconductor layer in accordance with the present principles.

Referring to FIG. 4, anchor structures or layers 19 (shown in phantom lines) are deposited at ends of U-shaped semiconductor layer 20. The anchor structures will support the U-shaped semiconductor layer 20 when the crystalline layer 14 is removed. The crystalline layer 14 is removed by a selective etch to leave the U-shaped semiconductor layer 20 and the substrate 12 intact. This creates a cavity 22 between the U-shaped semiconductor layers 20 and the substrate 12. The anchors 19 support the U-shaped semiconductor layer 20 on the substrate 12. The anchors 19 may include a dielectric material or the like deposited at end portions of the U-shaped semiconductor layer 20. The anchors 19 may include dielectric stripes butting portions of U-shaped semiconductor layer 20 and the substrate 12 so that the U-shaped semiconductor layer 20 is anchored to the substrate 12 even after the crystalline layer 14 is removed. The anchors 19 remain during the removal of crystalline layer 14.

Referring to FIG. 5, a deposition process is employed to back fill dielectric material 24 in the cavity 22 between U-shaped semiconductor layers 20 and the substrate 12. The dielectric material 24 may include, e.g., an oxide, a nitride, or another other suitable material or combinations of materials. The excess dielectric material 24 is removed from within the U-shaped semiconductor layers 20 and recessed down to level L by employing an etch process.

Referring to FIG. 6, the U-shaped semiconductor layers 20 include upright portions 30 and a lateral or transverse portion 32. A spacer formation process (e.g., 3 nm silicon nitride deposited by chemical vapor deposition (CVD) followed by a reactive ion etch (RIE) process) is employed to form spacers 26 on the upright portions 30 of the U-shaped semiconductor layers 20. The spacers 26 protect the upright portions 30 of the fin so that the transverse portion 32 can be reduced by one or more of the following processes described with reference to FIG. 7.

Figure 7:
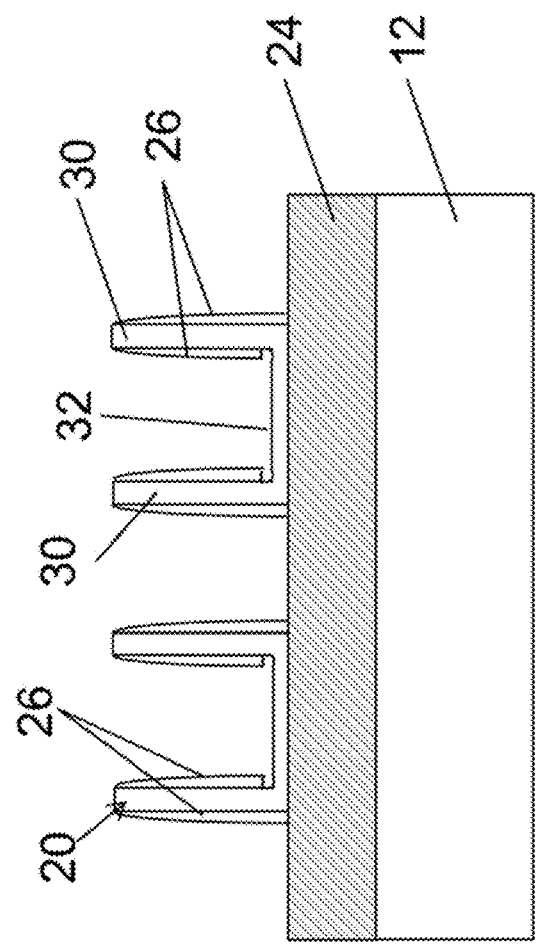
FIG. 7 is a cross-sectional view of the structure of FIG. 6 after etching to reduce a thickness of a lateral portion of the U-shaped semiconductor layer in accordance with the present principles.

Referring to FIG. 7, extremely thin semiconductor on insulator (ETSOI) thicknesses can be reduced by one of following processes: 1) a standard clean 1 (SC1) etch; 2) thermal oxidation followed by hydrofluoric acid etch; 3) chemical oxidation followed by hydrofluoric acid etch, or any other suitable process configured to adjust the thickness of the lateral or transverse portion 32. The lateral or transverse portion 32 has its thickness tuned or adjusted to be about one half the thickness of that of the upright portions 30. This is to provide similar electrostatic behavior in both portions of the U-shaped semiconductor layer 20.

Figure 8:
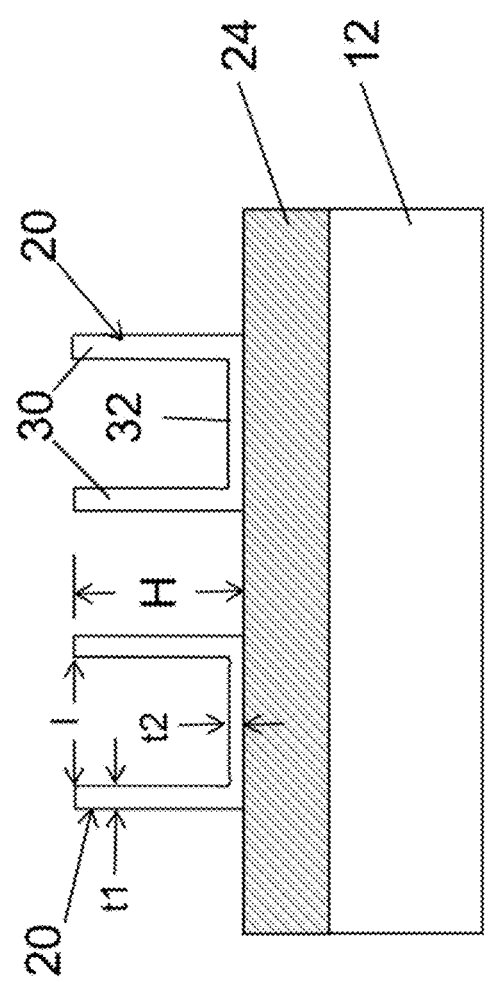
FIG. 8 is a cross-sectional view of the structure of FIG. 7 with the spacers removed from the upright portions of the U-shaped semiconductor layer in accordance with the present principles.

Referring to FIG. 8, the spacers 26 are stripped from the upright portions 30. This may be performed using a hot phosphorous etching process. The spacers 26 are removed to leave the U-shaped semiconductor layers 20. The U-shaped semiconductor layers 20 may include a height H of between about 15 nm to about 100 nm. The thickness t1 of the upright portions 30 may be between about 5 nm and about 30 nm. The lateral portion 32 of the U-shaped semiconductor layers 20 may include a length l between about 15 nm to about 100 nm.

The thickness t2 of the lateral portions 32 may be between about 2.5 nm and about 15 nm. The dimensions provided are illustrative and other dimensions, both larger and smaller are contemplated.

Referring to FIG. 9, the method continues to complete the device. In one embodiment, the flow to complete a finFET device is followed as modified to accommodate the U-shaped structure. FIG. 9 shows a perspective view of the U-shaped semiconductor layer 20 having a gate dielectric 36 and a gate conductor 38 (or dummy gate) formed and patterned over the U-shaped semiconductor layer 20.

Referring to FIG. 10, a cross-sectional view taken along section line 10-10 in FIG. 9 is shown after formation of sidewall spacers 44, source and drain region 40, 42 growth and field oxide 46 formation. The sidewall spacers 44 are formed by depositing and etching a dielectric layer, such as nitride, to form the spacers 44. Next, a preclean process (e.g., HF etch) and an epitaxial growth process are employed to grow source and drain regions 40, 42 from the U-shaped semiconductor layer 20. FIG. 10 shows a thickness of the lateral portion 32 of the U-shaped semiconductor layer 20 as a dashed line for reference.

FIG. 11 illustratively shows the formation of the source region 40 (drain region 42 would be on the opposite side of the gate/spacer 44) by providing a view along a longitudinal axis of the U-shaped semiconductor layer 20. It should be understood that the growth process may include, e.g., in-situ doped Si, SiGe or other suitable material. The growth may be either inside, outside or both on the U-shaped semiconductor layer 20. In one embodiment, the grown material connects upright portions 30 of adjacent U-shaped semiconductor layers 20 (e.g., in between layers 20 on the dielectric layer 24) to form merged regions. The grown material may be formed on the lateral portions 32 as well.

Referring again to FIG. 10, a field oxide 46 or other dielectric layer is formed and planarized down to the gate 38. Processing continues with gate replacement (replace dummy gate with a metal gate), a contact open through the field oxide 46 landing on the U-shaped semiconductor layer 20 and/or source/drain (S/D) regions 40/42. A silicidation process is then performed on the fins (20). Next, contacts are formed to the S/D regions 40/42 and gate (38). This is followed by interlevel dielectric layers and metallization formation. Other steps and processes may also be performed as needed.

It should be understood that while the present embodiments illustratively describe the formation of a finFET device that employs the U-shaped semiconductor layer 20, the U-shaped semiconductor layer 20 may be employed for or with other semiconductor devices, such as, e.g., diodes, conductive lines, capacitors, etc.

Figure 12:
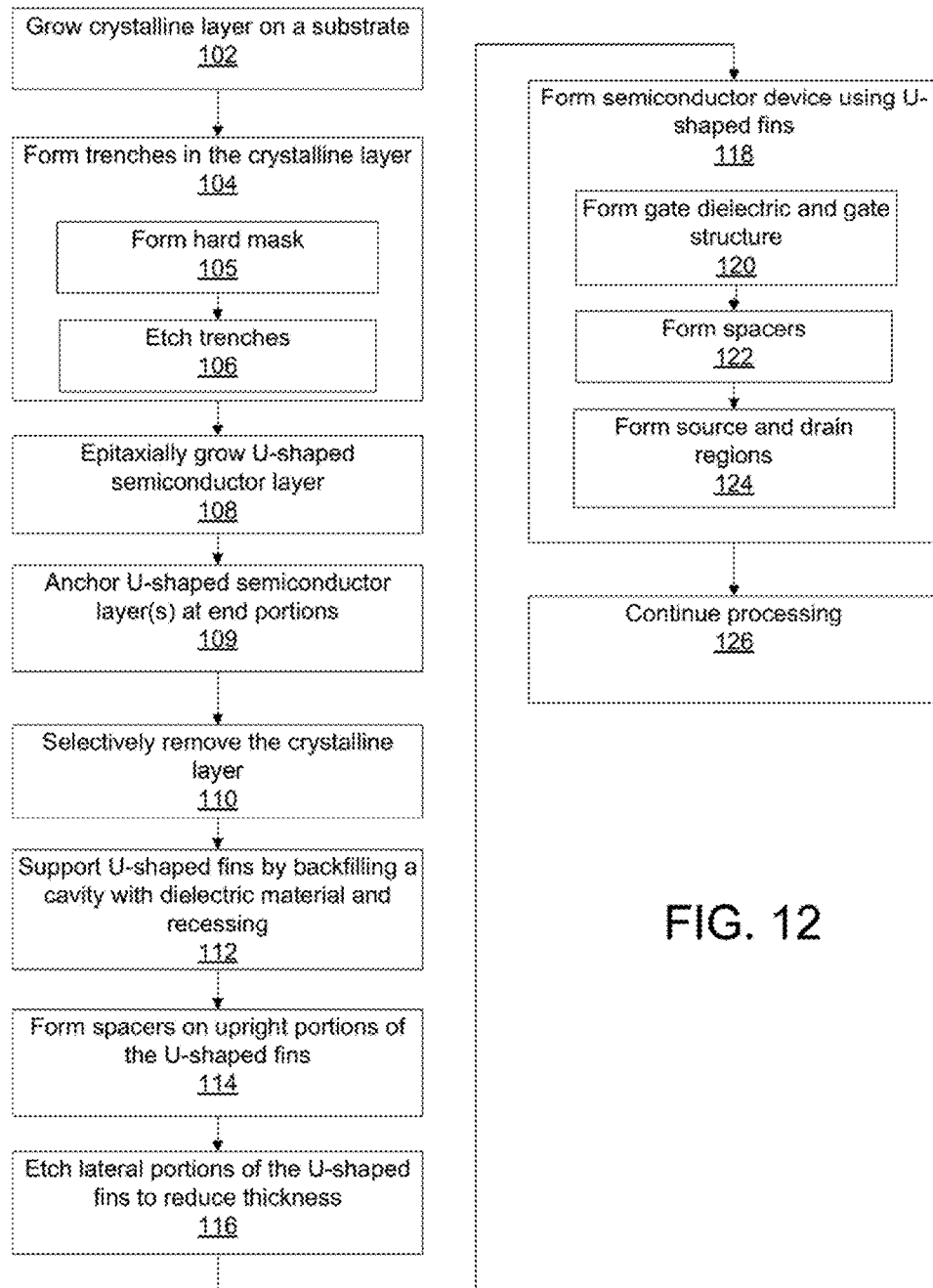
FIG. 12 is a block/flow diagram showing a method for forming a semiconductor device with a U-shaped semiconductor structure in accordance with one illustrative embodiment.

Referring to FIG. 12, a method for forming a semiconductor device with a U-shaped semiconductor structure is illustratively shown. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a crystalline layer is grown on a monocrystalline substrate. The crystalline layer should be selectively removable relative to the substrate. In one embodiment, the materials selection may include, for example, monocrystalline Si for the substrate and monocrystalline SiGe for the crystalline layer. Alternately, a SOI substrate may be provided and employed. In block 104, trenches are formed in the crystalline layer. In block 105, this may include depositing and patterning a hard mask and, in block 106, etching the crystalline layer using an anisotropic etch (e.g., reactive ion etching (RIE)). In block 108, a U-shaped semiconductor material is epitaxially grown along sidewalls and bottoms of the trenches to form U-shaped fins or lines. The U-shaped semiconductor material may include Si grown on SiGe of the crystalline layer. In block 109, the U-shaped semiconductor layer(s) are anchored at end portions by depositing an anchoring material. e.g., a dielectric. In block 110, the crystalline layer is selectively removed relative to the U-shaped fin, the substrate and the anchoring material. Anchor structures are formed at end portions of the U-shaped fins such that when the crystalline layer is removed a cavity is formed between the U-shaped fin and the substrate. In block 112, the U-shaped fins are supported by backfilling underneath the U-shaped fins with another dielectric material (e.g., an oxide).

In block 114, the U-shaped fins include upright portions and a lateral portion, spacers are formed on the upright portions to protect the upright portion during an etch of the lateral portion. In block 116, the lateral portion is etched to reduce its thickness. The etch may include one or more of: 1) a standard clean 1 (SC1) etch; 2) a thermal oxidation process followed by a HF etch; 3) a chemical oxidation process followed by a HF etch or other suitable process. The lateral portion may be etched to reduce the thickness to about one half that of an upright portion.

In block 118, a semiconductor device is formed using the U-shaped fins or lines. In one embodiment, a gate dielectric and a gate structure (e.g., metal gate or dummy gate) are formed transversely over a longitudinal direction of the U-shaped fins in block 120. In block 122, spacers may be formed parallel and in contact with the gate structure.

In block 124, source and drain (S/D) regions are formed adjacent to the spacers by epitaxially growing the source and drain regions from the U-shaped semiconductor material. The S/D regions may be doped in-situ. The S/D regions may include SiGe grown on Si of the U-shaped fins to merge the fins by connecting upright portions between the fins. In one embodiment, the epitaxially grown S/D region material may be formed on the lateral portions of the fins as well. In one embodiment, the U-shaped fins form a fin field effect transistor wherein a channel is formed through the U-shaped semiconductor material. Processing continues to complete the device or devices in block 126.

Having described preferred embodiments for U-shaped semiconductor structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A U-shaped semiconductor device, comprising:
    a U-shaped semiconductor material having a lateral portion and two upright portions integrally formed with and extending from the lateral portion, the U-shaped semiconductor material being monocrystalline and forming a fin structure with a U-shaped cross-section, the U-shaped semiconductor material being supported by an anchor structure formed underneath the U-shaped semiconductor material and a backfilled dielectric material such that the backfilled dielectric material formed underneath the U-shaped semiconductor material remains undamaged by formation processes of the U-shaped semiconductor material;
    a gate structure formed transversely to a longitudinal axis of the fin structure; and
    source and drain regions formed on opposite sides of the gate structure and being formed on the fin structure.

2. The device as recited in claim 1, further comprising a monocrystalline substrate on which the backfilled dielectric material is formed.

3. The device as recited in claim 1, wherein the lateral portion includes a thickness of about one half that of one of the two upright portions.

4. The device as recited in claim 1, wherein the source and drain regions are formed over the lateral portion of the U-shaped semiconductor material.

5. The device as recited in claim 1, wherein the source and drain regions are formed between upright portions of adjacent portions of the U-shaped semiconductor material.

6. The device as recited in claim 1, wherein the semiconductor device includes a fin field effect transistor wherein a channel is formed through the U-shaped semiconductor material.

7. The device as recited in claim 1, wherein the source and drain regions are formed between the two upright portions of the U-shaped semiconductor material.

8. The device as recited in claim 1, wherein the anchor structure includes dielectric material formed at end portions of the U-shaped semiconductor material.

9. The device as recited in claim 1, wherein the anchor structure includes dielectric stripes butting portions of the U-shaped semiconductor material.

10. The device as recited in claim 1, wherein the gate structure comprises a gate dielectric layer and/or a gate conductor layer.

11. The device as recited in claim 1, wherein the semiconductor device further comprises a field oxide formed over the U-shaped semiconductor material and/or source and drain regions.

12. The device as recited in claim 11, wherein the semiconductor device further comprises contacts wherein the contacts are formed through the field oxide to the source and drain regions and/or the gate structure.

* * * * *